United States Patent
Kim et al.

(10) Patent No.: US 10,573,267 B2
(45) Date of Patent: Feb. 25, 2020

(54) SCAN DRIVER AND DRIVING METHOD THEREOF

(71) Applicant: SAMSUNG DISPLAY CO., LTD., Yongin-si, Gyeonggi-do (KR)

(72) Inventors: June Hwan Kim, Yongin-si (KR); Hyo Jung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 175 days.

(21) Appl. No.: 15/791,737

(22) Filed: Oct. 24, 2017

(65) Prior Publication Data

US 2018/0144703 A1 May 24, 2018

(30) Foreign Application Priority Data

Nov. 18, 2016 (KR) ........................ 10-2016-0154157

(51) Int. Cl.
*G11C 19/00* (2006.01)
*G09G 3/36* (2006.01)
*G11C 19/28* (2006.01)

(52) U.S. Cl.
CPC ... *G09G 3/3677* (2013.01); *G09G 2300/0809* (2013.01); *G09G 2310/0202* (2013.01); *G09G 2310/0286* (2013.01); *G09G 2310/08* (2013.01); *G11C 19/28* (2013.01)

(58) Field of Classification Search
None
See application file for complete search history.

(56) References Cited

U.S. PATENT DOCUMENTS

| 7,872,628 | B2 | 1/2011 | Cho |
| 9,276,123 | B2 | 3/2016 | Wakana et al. |
| 9,355,741 | B2 | 5/2016 | Jeon et al. |
| 2013/0083885 | A1* | 4/2013 | Lee .................... G11C 19/28 377/69 |
| 2014/0264321 | A1 | 9/2014 | Liang et al. |
| 2015/0262703 | A1* | 9/2015 | Murakami ............... G09G 3/20 345/214 |

(Continued)

FOREIGN PATENT DOCUMENTS

| KR | 101127813 B1 | 3/2012 |
| KR | 1020150011910 A | 2/2015 |

OTHER PUBLICATIONS

Jae Chul Park et al., Highly Stable Transparent Amorphous Oxide Semiconductor Thin-Film Transistors Having Double-Stacked Active Layers, 2010, p. 5512-5516, 22, Advanced Materials, Wiley-VCH Verlag GmbH & Co. KGaA.

(Continued)

*Primary Examiner* — Tuan T Lam
(74) *Attorney, Agent, or Firm* — Cantor Colburn LLP

(57) ABSTRACT

A scan driver includes a plurality of clock lines which receive clock signals in different phases, a plurality of stages connected with at least one of the plurality of clock lines, an initialization line which receives an initialization pulse, a first control transistor, which is connected between the initialization line and each of the plurality of clock lines, and which is turned on when the initialization pulse is supplied, and a second control transistor, which is connected between the initialization line and each of the plurality of stages, and which is turned on when the initialization pulse is supplied.

16 Claims, 6 Drawing Sheets

(56) References Cited

U.S. PATENT DOCUMENTS

| | | | | |
|---|---|---|---|---|
| 2015/0279481 | A1* | 10/2015 | Sasaki | G11C 19/184 |
| | | | | 377/69 |
| 2015/0379912 | A1* | 12/2015 | Wen | G09G 3/20 |
| | | | | 345/92 |
| 2016/0018844 | A1* | 1/2016 | Sasaki | G11C 19/28 |
| | | | | 713/600 |
| 2016/0027527 | A1* | 1/2016 | Murakami | G09G 3/3677 |
| | | | | 377/64 |
| 2017/0116923 | A1* | 4/2017 | Bae | G09G 3/3266 |
| 2017/0194166 | A1* | 7/2017 | Tan | H01L 21/32136 |
| 2018/0122320 | A1* | 5/2018 | Sasaki | G11C 19/28 |
| 2018/0137831 | A1* | 5/2018 | Murakami | G09G 3/20 |
| 2018/0144702 | A1* | 5/2018 | Furuta | G09G 3/20 |

OTHER PUBLICATIONS

Sun Il Kim et al., High Reliable and Manufacturable Gallium Indium Zinc Oxide Thin-Film Transistors Using the Double Layers as an Active Layer, 2009, p. H184-H187, 156, Journal of the Electrochemical Society, ECS.

Toshio Kamiya et al., Origins of High Mobility and Low Operation Voltage of Amorphous Oxide TFTs: Electronic Structure, Electron Transport, Defects and Doping, 2009, p. 468-483, vol. 5, No. 12, Journal of Display Technology.

* cited by examiner

SCAN DRIVER AND DRIVING METHOD THEREOF

The application claims priority to Korean Patent Application No. 10-2016-0154157, filed on Nov. 18, 2016, and all the benefits accruing therefrom under 35 U.S.C. § 119, the content of which in its entirety is herein incorporated by reference.

BACKGROUND

1. Field

Various exemplary embodiments of the invention relate to a scan driver and a method for driving the same, and more particularly, to a scan driver for guaranteeing the reliability of operation and a method for driving the scan driver.

2. Description of the Related Art

With a development of information technology, an importance of a display device that is a medium for connecting information and users has been emphasized. Accordingly, a use of display devices, such as a liquid crystal display device ("LCD"), an organic light-emitting display device ("OLED"), and the like, has been increasing.

Generally, the display device includes a data driver for supplying data signals to data lines, a scan driver for supplying scan signals to scan lines, and a pixel unit including pixels located in regions segmented by scan lines and data lines.

Pixels included in the pixel unit may be selected when a scan signal is supplied to a scan line, and may receive a data signal from a data line. The pixels that received the data signal emit light having the luminance corresponding to the data signal to an outside.

The scan driver includes stages connected to scan lines. The stages supply scan signals to the scan line connected thereto in response to signals from a timing controller. To this end, each of the stages is configured with P-type, e.g., P-type metal oxide semiconductor ("PMOS"), and/or N-type, e.g., N-type metal oxide semiconductor ("NMOS"), transistors, and may be mounted on a panel along with pixels. When stages are mounted on a panel along with pixels, manufacturing costs may be reduced.

SUMMARY

When a stage is implemented with N-type transistors, a transistor may not be turned off due to a change of the characteristics thereof. When a negative gate-source voltage Vgs is periodically applied to an N-type transistor, for example, the negative shift of a threshold voltage is caused, whereby the transistor may not be turned off.

Various exemplary embodiments of the invention are directed to a provision of a scan driver for guaranteeing the reliability of operation and a method for driving the scan driver.

An exemplary embodiment of the invention may provide a scan driver. The scan driver may include a plurality of clock lines which receive clock signals in different phases, a plurality of stages connected with at least one of the plurality of clock lines, an initialization line which receives an initialization pulse, a first control transistor, connected between the initialization line and each of the plurality of clock lines, the first control transistor being turned on when the initialization pulse is supplied, and a second control transistor, connected between the initialization line and each of the plurality of stages, the second control transistor being turned on when the initialization pulse is supplied.

According to an exemplary embodiment, the initialization pulse may be supplied when power is supplied to the scan driver.

According to an exemplary embodiment, the initialization pulse may be supplied when supply of power to the scan driver is interrupted.

According to an exemplary embodiment, each of the plurality of stages may include first to fourth input terminals, an output unit which is connected with the first input terminal, the second power input terminal, a first node, and a second node and supplies a scan signal to an output terminal, the first input terminal being connected with a first clock line that is one of the plurality of clock lines, and the second power input terminal being supplied with a gate-off voltage, a first control unit which is connected with the first input terminal and the output terminal and controls a voltage of the first node, a second control unit which is connected with the first power input terminal and stabilizes a voltage of the second node, the first power input terminal being supplied with a gate-on voltage, an input unit which is connected with the second input terminal, the fourth input terminal, the output terminal, and the first power input terminal and controls the voltage of the first node, the second input terminal receiving a scan signal of a previous stage, and the fourth input terminal receiving a scan signal of a next stage, a first transistor, connected between the third input terminal and the second node and including a gate electrode connected with the first node, the third input terminal being connected with a second clock line that is one of the plurality of clock lines, and a second transistor, connected between the second node and the first power input terminal and including a gate electrode connected with the third input terminal.

According to an exemplary embodiment, the second control transistor may be connected between the second input terminal and the initialization line.

According to an exemplary embodiment, when the initialization pulse is supplied, a gate-source voltage Vgs and a drain-source voltage Vds of the first transistor and the second transistor may be set to a positive voltage during at least some period of time.

According to an exemplary embodiment, the gate-source voltage Vgs and the drain-source voltage Vds may be set to a same voltage as each other.

According to an exemplary embodiment, a high-level period of a clock signal supplied to the first clock line may not overlap a high-level period of a clock signal supplied to the second clock line.

According to an exemplary embodiment, the output unit may include a third transistor, connected between the first input terminal and the output terminal and including a gate electrode connected with the first node, a fourth transistor, connected between the output terminal and the second power input terminal and including a gate electrode connected with the second node, a first capacitor connected between the first node and the output terminal, and a second capacitor connected between the second node and the second power input terminal.

According to an exemplary embodiment, the first control unit may include a third transistor and a fourth transistor, which are connected in series between the first node and the output terminal, wherein a gate electrode of the third transistor may be connected with the first input terminal, and a gate electrode of the fourth transistor may be connected with the second node.

According to an exemplary embodiment, the second control unit may include a third transistor, connected between the second node and the first power input terminal and including a gate electrode connected with the second node.

According to an exemplary embodiment, the input unit may include a third transistor, connected between the output terminal and the first node and including a gate electrode connected with the fourth input terminal, and a fourth transistor, connected between the first power input terminal and the first node and including a gate electrode connected with the second input terminal.

An exemplary embodiment of the invention may provide a method for driving a scan driver that includes stages. The method may include supplying an initialization pulse to the stages in order to cause a positive shift of a threshold voltage of at least one transistor included in the stages, and when the initialization pulse is supplied, a gate-source voltage Vgs and a drain-source voltage Vds of the at least one transistor may be set to a positive voltage.

According to an exemplary embodiment, the gate-source voltage Vgs and the drain-source voltage Vds may be set to a same voltage as each other.

According to an exemplary embodiment, the initialization pulse may be supplied when power is supplied to the scan driver.

According to an exemplary embodiment, the initialization pulse may be supplied when supply of power to the scan driver is interrupted.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1A:
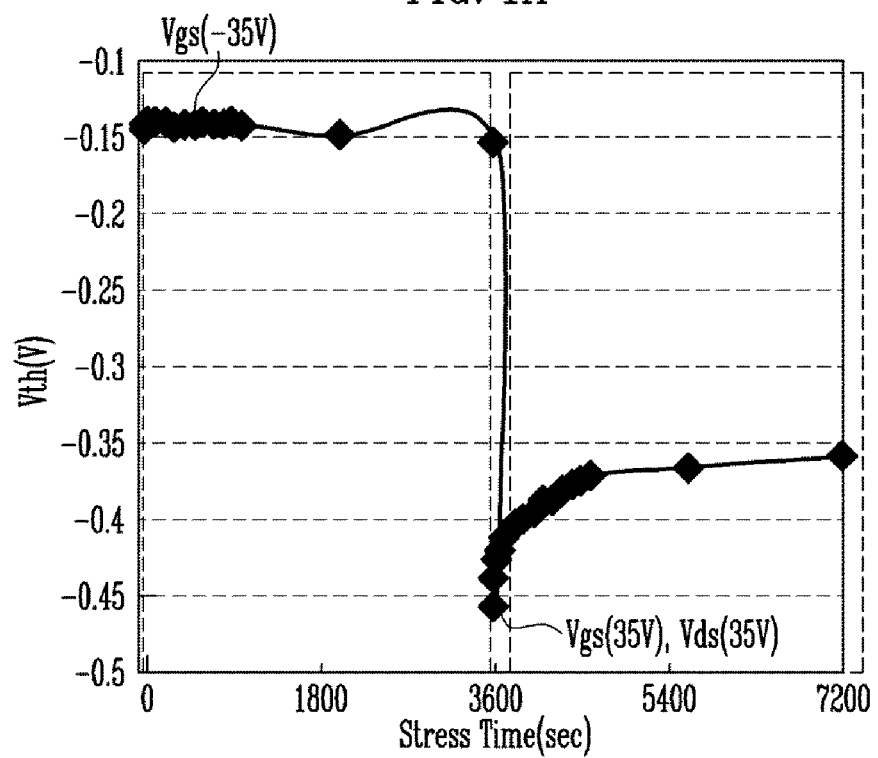
FIG. 1A and FIG. 1B are views illustrating an exemplary embodiment of a method for initializing the characteristics of a transistor according to the invention.

Exemplary embodiments will now be described more fully hereinafter with reference to the accompanying drawings; however, they may be embodied in different forms and should not be construed as limited to the exemplary embodiments set forth herein. Rather, these exemplary embodiments are provided so that this invention will be thorough and complete, and will fully convey the scope of the exemplary embodiments to those skilled in the art.

That is, it is noted that in this specification, the invention is not limited to the following exemplary embodiments, but may be implemented in different various forms. In the following description, "connected/coupled" refers to one component not only directly coupling another component but also indirectly coupling another component through an intermediate component. On the other hand, "directly connected/directly coupled" refers to one component directly coupling another component without an intermediate component. Further, it is also noted that the same reference numerals are used to designate the same or similar elements throughout the drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The ordinal number in the detailed description may not be the same as that of the claims due to an introduction order of elements in the claims. For example, "fifth transistor" of the detailed description could correspond to "third transistor" in the claims.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 1B:
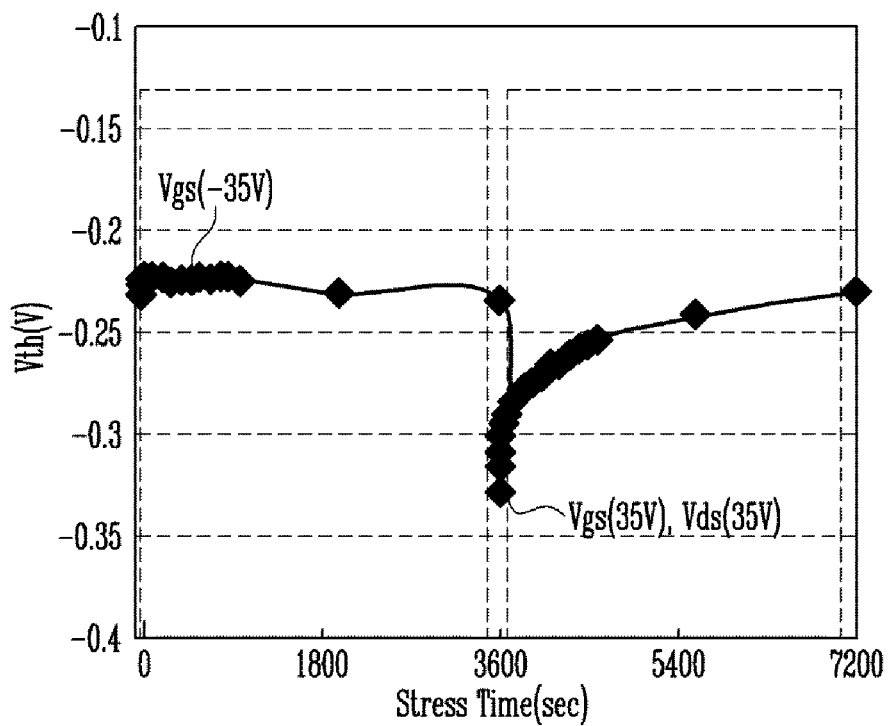

FIGS. 1A and 1B are views that show a method for initializing the characteristics of a transistor according to an exemplary embodiment of the invention. FIGS. 1A and 1B show the results of an experiment conducted using N-type transistors having different initial threshold voltages in order to respond to various conditions.

Referring to FIGS. 1A and 1B, in an exemplary embodiment, the gate-source voltage Vgs of an N-type transistor is set to a negative voltage, for example, −about 35 volts (V). Then, in order to make the condition similar to the driving condition of a stage, light having the predetermined luminance, for example, about 500 nits, is supplied to the N-type transistor.

In this case, the threshold voltage of the N-type transistor is negatively shifted after a predetermined time. In an exemplary embodiment, the threshold voltage of the N-type transistor may decrease from about −0.15V to about −0.48V, as shown in FIG. 1A, for example. Also, the threshold voltage of an N-type transistor may decrease from about −0.23V to about −0.33V, as shown in FIG. 1B. When the threshold voltage of an N-type transistor decreases, a leakage current is generated in the turn-off conditions of the N-type transistor, which degrades the reliability of operation.

An exemplary embodiment of the invention sets the gate-source voltage Vgs and the drain-source voltage Vds of an N-type transistor to a positive voltage such that the threshold voltage of the N-type transistor is positively shifted. In an exemplary embodiment, the gate-source voltage Vgs and the drain-source voltage Vds may be set to the same voltage as each other, for example, both the gate-source voltage Vgs and the drain-source voltage Vds may be set to about 35V.

As illustrated in FIG. 1A, when the gate-source voltage Vgs and the drain-source voltage Vds of an N-type transistor are set to 35V, the threshold voltage is positively shifted. Particularly, when the gate-source voltage Vgs and the drain-source voltage Vds are set to 35V during a part of a single frame, for example, 0.01 percent (%) of a single frame (1.67 microseconds (μs) at 60 Hertz (Hz)), the threshold voltage of the N-type transistor is changed from about −0.48V to about −0.37V.

As illustrated in FIG. 1B, when the gate-source voltage Vgs and the drain-source voltage Vds of an N-type transistor are set to 35V, the threshold voltage is positively shifted. Particularly, when the gate-source voltage Vgs and the drain-source voltage Vds are set to 35V during a part of a single frame, for example, 0.05% of a single frame (8.33 μs at 60 Hz), the threshold voltage of the N-type transistor is changed from about −0.33V to about −0.23V. That is, when the gate-source voltage Vgs and the drain-source voltage Vds of an N-type transistor are set to a positive voltage, the threshold voltage characteristic is initialized (that is, positively shifted), whereby the reliability of operation may be guaranteed.

The threshold voltage characteristic of an N-type transistor is slowly shifted positively after positive gate-source voltage Vgs and drain-source voltage Vds are applied thereto. In an exemplary embodiment of the invention, in order to stably initialize the threshold voltage characteristic of an N-type transistor, the threshold voltage characteristic of the N-type transistor is initialized when power is supplied to a display device and/or when the supply of power thereto is interrupted. In this case, the time to be taken for initializing the threshold voltage characteristic of an N-type transistor may be secured, whereby the reliability of operation may be improved.

Figure 2:
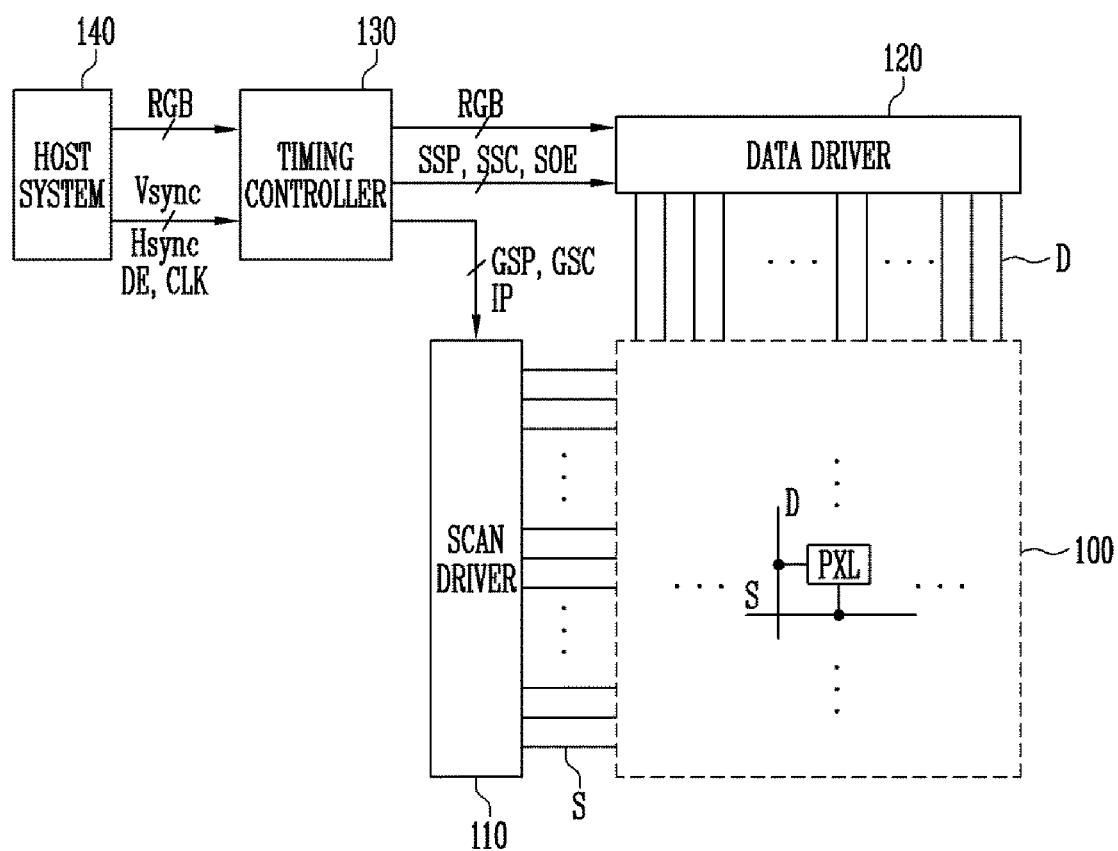
FIG. 2 is a view schematically illustrating an exemplary embodiment of a display device according to the invention.

FIG. 2 is a view that schematically shows a display device according to an exemplary embodiment of the invention.

Referring to FIG. 2, a display device according to an exemplary embodiment of the invention includes a pixel unit 100, a scan driver 110, a data driver 120, a timing controller 130, and a host system 140.

The pixel unit 100 includes a plurality of pixels PXL that are located such that each of the pixels PXL is connected with a data line D and a scan line S. The pixels PXL provide light having predetermined luminance to the outside in response to a data signal.

When a display device is an organic light-emitting display ("OLED"), each of the pixels PXL includes an organic light-emitting diode (not illustrated) and a plurality of transistors including a driving transistor (not illustrated). A pixel PXL is selected when a scan signal is supplied to a scan line S, and receives a data signal from a data line D. Then, the driving transistor included in the pixel PXL supplies a current, corresponding to the data signal, to the organic light-emitting diode, whereby light having predetermined luminance is generated in the organic light-emitting diode.

In an exemplary embodiment, when a display device is a liquid crystal display ("LCD"), each of the pixels PXL includes a switching transistor (not illustrated) and a liquid-crystal capacitor (not illustrated). A pixel PXL is selected when a scan signal is supplied to a scan line S, and receives a data signal from a data line D. Then, the pixel PXL controls the transmissivity of the liquid crystal in response to the data signal, whereby light having predetermined luminance is provided to the outside.

The data driver 120 generates a data signal using image data RGB, input from the timing controller 130. The data signal, generated by the data driver 120, is supplied to data lines D.

Figure 3:
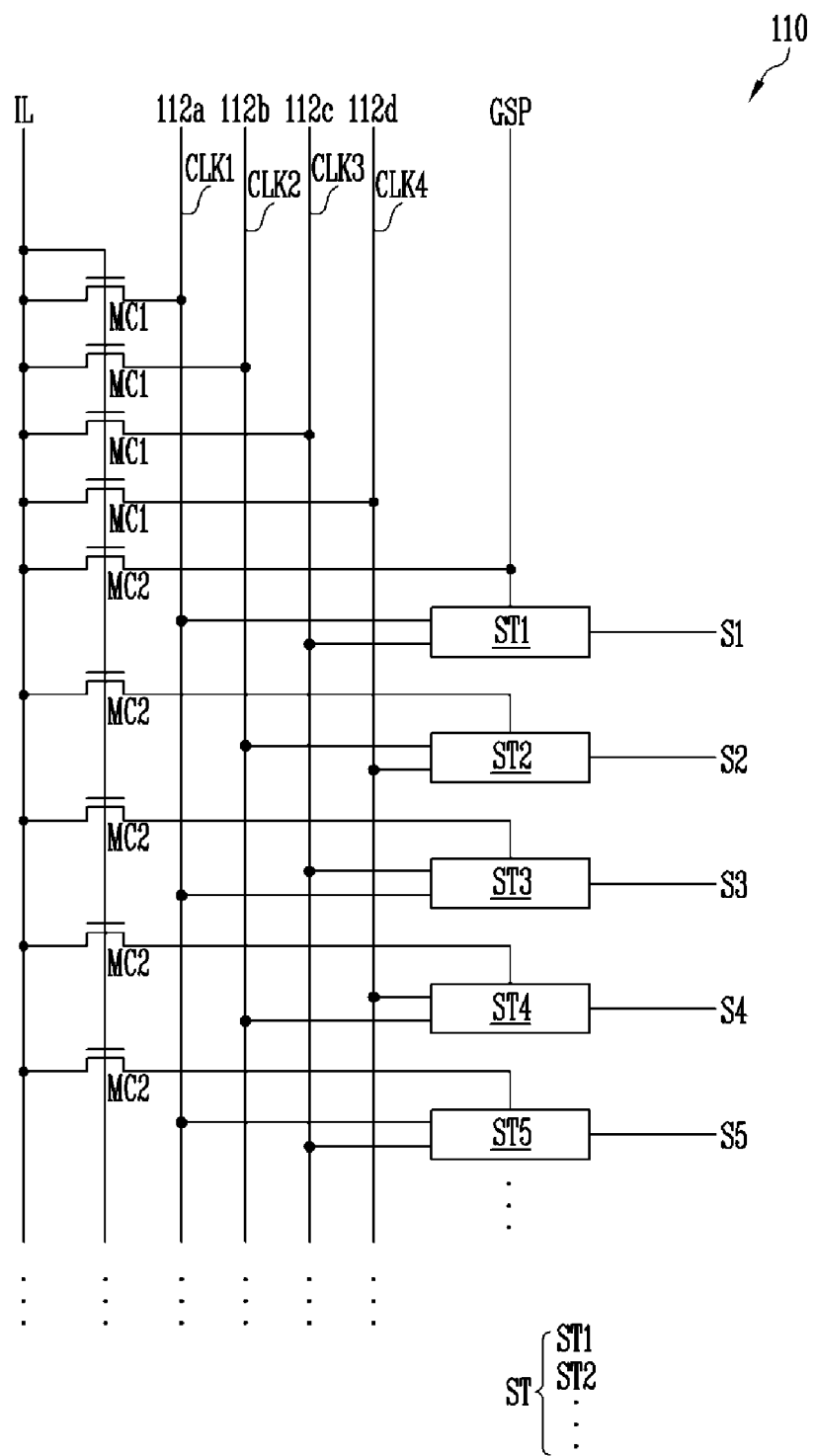
FIG. 3 is a view schematically illustrating the scan driver illustrated in FIG. 2.

The scan driver 110 supplies scan signals to scan lines S. In an exemplary embodiment, the scan driver 110 may sequentially supply scan signals to the scan lines S, for example. When scan signals are sequentially supplied to the scan lines S, pixels in a horizontal line are selected, and the pixels, selected by the scan signals, receive a data signal. To this end, the scan driver 110 includes stages ST, each of which is connected to each of the scan lines S, as illustrated in FIG. 3. The scan driver 110 may be disposed (e.g., mounted) on a panel. That is, the scan driver 110 may be disposed (e.g., mounted) on a substrate using a thin film process. Also, the scan driver 110 may be disposed (e.g., mounted) on opposite sides of the pixel unit 100.

The timing controller 130 supplies a gate control signal and a data control signal to the scan driver 110 and the data driver 120, respectively, based on timing signals, such as image data RGB, a vertical synchronization signal Vsync, a horizontal synchronization signal Hsync, a data-enable signal DE, a clock signal CLK, and the like, which are output from the host system 140.

The gate control signal includes a gate start pulse GSP, one or more gate shift clocks GSC, and an initialization pulse IP. The gate start pulse GSP controls the timing of a first scan signal. The gate shift clocks GSC represent one or more clock signals for shifting the gate start pulse. The initialization pulse IP represents a signal for initializing the threshold voltage of one or more transistors included in the stage ST. The initialization pulse IP may be supplied when power is supplied to the display device (that is, the scan driver 110) and/or when power is turned off, so that the initialization pulse IP does not affect the operation of the stage and the threshold voltage is stably initialized.

The data control signal includes a source start pulse SSP, a source sampling clock SSC, a source output-enable signal SOE, and the like. The source start pulse SSP controls the data-sampling start point of the data driver 120. The source sampling clock SSC controls the sampling operation of the data driver 120 based on a rising or falling edge. The source output-enable signal SOE controls the output timing of the data driver 120.

The host system 140 supplies image data RGB to the timing controller 130 via a predetermined interface. Also, the host system 140 supplies timing signals (Vsync, Hsync, DE, and CLK) to the timing controller 130.

FIG. 3 is a view that schematically shows the scan driver illustrated in FIG. 2. In FIG. 3, only five stages are illustrated for the convenience of description.

Referring to FIG. 3, the scan driver 110 according to an exemplary embodiment of the invention includes a plurality of stages ST1 to ST5. The stages ST1 to ST5 are respectively connected with scan lines S1 to S5, and supplies scan signals to the scan lines S1 to S5 in response to a gate start pulse GSP. Here, the i-th stage STi (where i is a natural number) is connected with the i-th scan line Si, and may supply a scan signal to the i-th scan line Si.

Each of the stages ST1 to ST5 is connected with two of clock lines 112a to 112d. The timing controller 130 supplies a first clock signal CLK1 to a first clock line 112a and supplies a second clock signal CLK2 to a second clock line 112b. Also, the timing controller 130 supplies a third clock signal CLK3 to a third clock line 112c and supplies a fourth clock signal CLK4 to a fourth clock line 112d.

Figure 6:
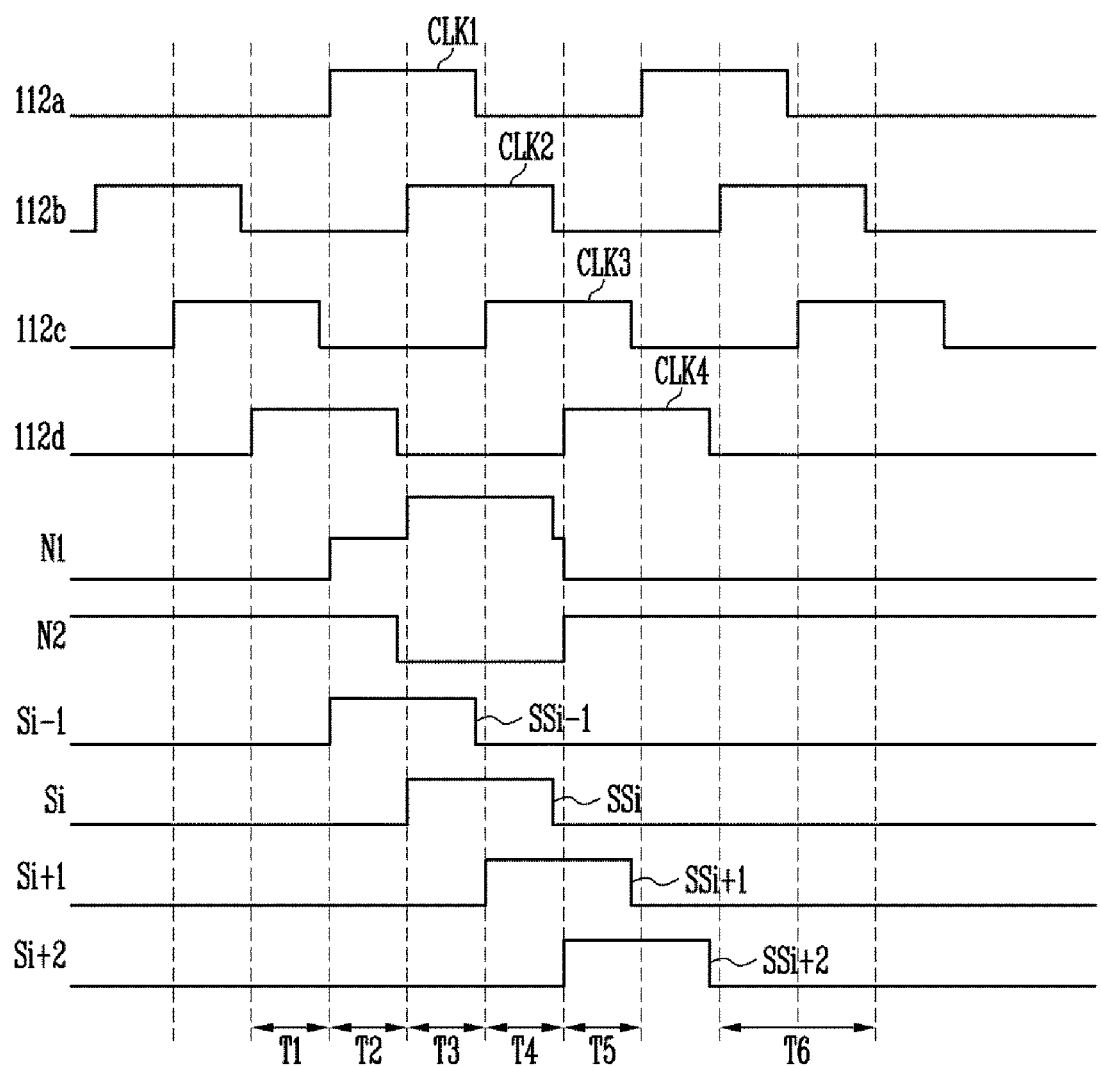
FIG. 6 is a waveform diagram illustrating a method for driving the stage circuit illustrated in FIG. 5.

The first clock signal CLK1 to the fourth clock signal CLK4 are a square wave signal in which a high level and a low level are repeatedly presented as shown in FIG. 6. The first clock signal CLK1 to the fourth clock signal CLK4 are sequentially supplied, and the currently supplied clock signal is provided such that a high-level period thereof overlaps that of a previously supplied clock signal.

Each of the stages ST1 to ST5 receives two clock signals, among the clock signals CLK1 to CLK4, which are supplied from the timing controller 130 as the gate shift clocks GSC.

The j-th stage STj (where j is 1, 5, 9, . . . ) receives the first clock signal CLK1 and the third clock signal CLK3, and the j+1-th stage STj+1 receives the second clock signal CLK2 and the fourth clock signal CLK4. Also, j+2-th stage STj+2 receives the third clock signal CLK3 and the first clock signal CLK1, and the j+3-th stage STj+3 receives the fourth clock signal CLK4 and the second clock signal CLK2.

Here, clock signals CLK supplied to the same stage, for example, the first clock signal CLK1 and the third clock signal CLK3 supplied to the j-th stage STj, have high-level periods that do not overlap each other.

The scan driver 110 according to an exemplary embodiment of the invention includes an initialization line IL, first control transistors MC1, and second control transistors MC2.

The initialization line IL receives an initialization pulse IP from the timing controller 130. The initialization pulse IP is used to initialize the threshold voltage of at least one transistor included in each of the stages ST1 to ST5.

The first control transistors MC1 are located between the initialization line IL and the respective clock signals 112a to 112d. Also, the gate electrode of each of the first control transistors MC1 is connected with the initialization line IL. The first control transistors MC1 are turned on when the initialization pulse IP is supplied to the initialization line IL, and supply the initialization pulse IP to the clock lines 112a to 112d.

The second control transistors MC2 are located between the initialization line IL and the respective stages ST1 to ST5. In an exemplary embodiment, each of the second control transistors MC2 is included in a stage ST, and may be connected with a second input terminal (not illustrated) for receiving the scan signal of a previous stage or a gate start pulse GSP, for example.

The gate electrode of each of the second control transistors MC2 is connected with the initialization line IL. The second control transistors MC2 are turned on when the initialization pulse IP is supplied to the initialization line IL, and supply the initialization pulse IP to the stages ST1 to ST5.

In an exemplary embodiment of the invention, the first control transistors MC1 and the second control transistors MC2 may have the same conductivity type as that of transistors included in each of the stages ST1 to ST5. In an exemplary embodiment, the first control transistors MC1 and the second control transistors MC2 may be provided with an N-type transistor, e.g., N-type metal oxide semiconductor ("NMOS").

Figure 4:
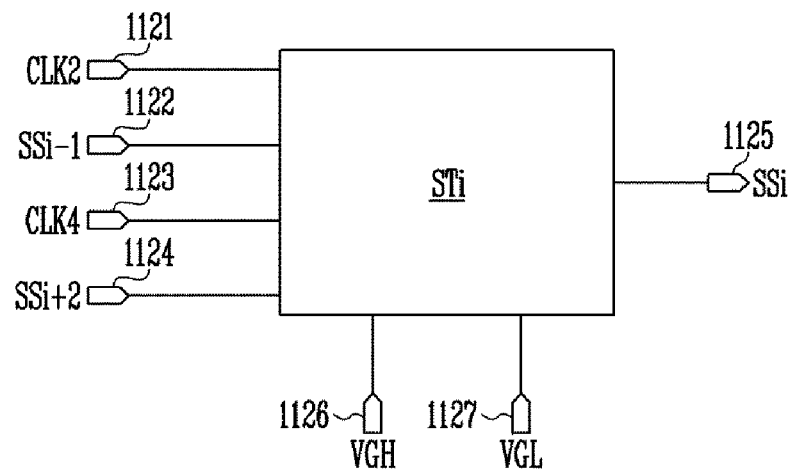
FIG. 4 is a view illustrating an exemplary embodiment of the stage-connecting terminal illustrated in FIG. 3.

FIG. 4 is a view that shows an exemplary embodiment of the stage-connecting terminal illustrated in FIG. 3. In FIG. 4, the i-th stage STi is illustrated for the convenience of description, and the i-th stage STi is assumed to receive the second clock signal CLK2 and the fourth clock signal CLK4.

Referring to FIG. 4, the stage STi according to an exemplary embodiment of the invention includes a first input terminal 1121, a second input terminal 1122, a third input terminal 1123, a fourth input terminal 1124, an output terminal 1125, a first power input terminal 1126, and a second power input terminal 1127.

The first input terminal 1121 receives the second clock signal CLK2. The first input terminal 1121 is connected with the initialization line IL via the second clock line 112b and the first control transistor MC1.

The second input terminal 1122 receives the scan signal of a previous stage STi−1, for example, the i−1-th scan signal SSi−1. Here, when the i-th stage STi is set to the first stage (i.e., i is one), a gate start pulse GSP is supplied to the second input terminal 1122. Also, the second input terminal 1122 is connected with the initialization line IL via the second control transistor MC2.

The third input terminal 1123 receives the fourth clock signal CLK4. The third input terminal 1123 is connected with the initialization line IL via the fourth clock line 112*d* and the first control transistor MC1.

The fourth input terminal 1124 receives the scan signal of a next stage STi+2, for example, the i+2-th scan signal SSi+2.

The output terminal 1125 outputs the scan signal SSi of the i-th stage STi. The scan signal SSi, supplied to the output terminal 1125 of the i-th stage STi, is supplied to the i-th scan line Si. Also, the scan signal SSi, supplied to the output terminal 1125 of the i-th stage STi, is supplied to the second input terminal 1122 of a next stage STi+1 and the fourth input terminal 1124 of a previous stage STi−2.

The first power input terminal 1126 is supplied with a gate-on voltage VGH, and the second power input terminal 1127 is supplied with a gate-off voltage VGL. The gate-on voltage VGH means a voltage for turning on a transistor included in the stage STi, and the gate-off voltage VGL means a voltage for turning off the transistor included in the stage STi. To this end, the gate-on voltage VGH may be set higher than the gate-off voltage VGL.

Also, the high-level of the clock signals CLK1 to CLK4 may be set to the gate-on voltage VGH, and the low-level thereof may be set to the gate-off voltage VGL. The gate-on voltage VGH and the gate-off voltage VGL may be experimentally set in consideration of the circuit structure of the stage STi, the operation conditions, the resolution of a panel, and the like.

Figure 5:
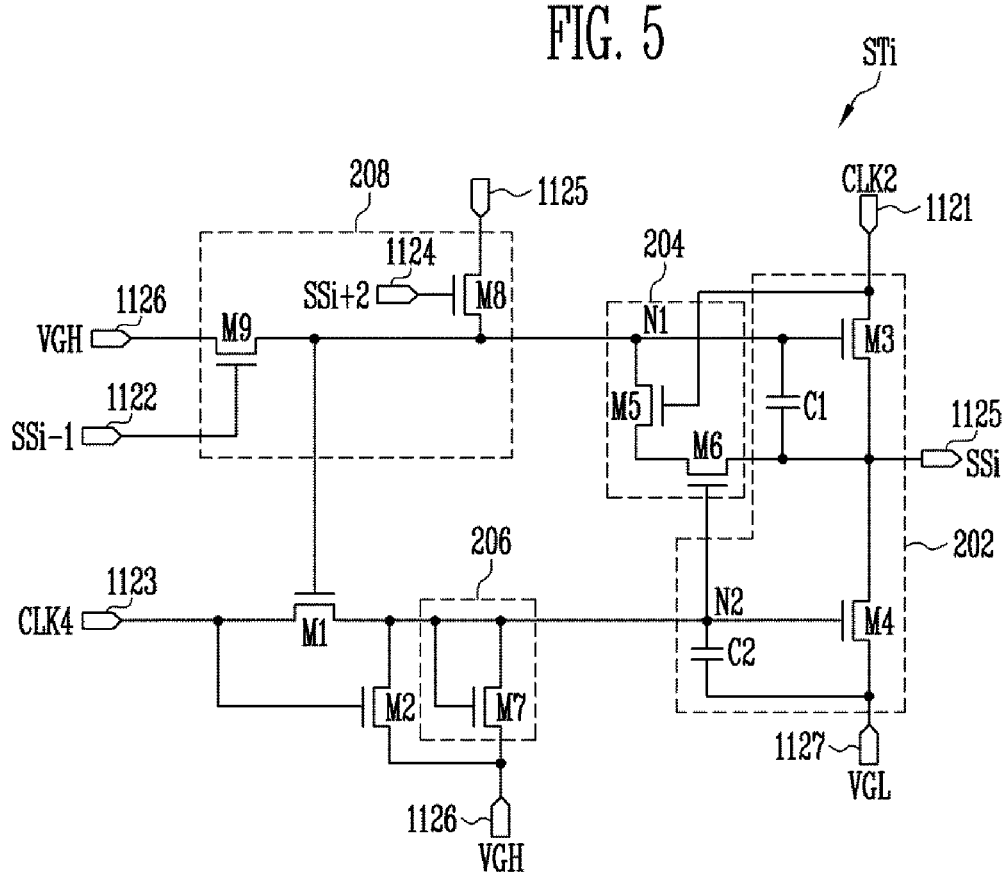
FIG. 5 is a view illustrating an exemplary embodiment of the stage of a circuit diagram according to the exemplary embodiment of the stage illustrated in FIG. 4.

FIG. 5 is a view that shows a circuit diagram according to an exemplary embodiment of the stage illustrated in FIG. 4. Hereinafter, the supply of a clock signal means the supply of a gate-on voltage for turning on a transistor, that is, the supply of a high-level voltage.

Referring to FIG. 5, the stage STi according to an exemplary embodiment of the invention includes an output unit 202, a first control unit 204, a second control unit 206, an input unit 208, a first transistor M1, and a second transistor M2. The first transistor M1, the second transistor M2, and transistors M3 to M9, included in the output unit 202, the first control unit 204, the second control unit 206, and the input unit 208, are set to N-type transistors. That is, the transistors M1 to M9 included in the stage STi are set to N-type transistors in an exemplary embodiment of the invention.

In an exemplary embodiment, the active layer of the transistors M1 to M9 may be provided with an oxide or a polymer. The transistors M1 to M9 may have a top-gate structure and a bottom-gate structure. Also, a source electrode, a gate electrode, and a drain electrode included in the transistors M1 to M9 may be provided with transparent or opaque material.

The output unit 202 controls the voltage at the output terminal 1125 in response to the second clock signal CLK2 supplied to the first input terminal 1121, the gate-off voltage VGL supplied to the second power input terminal 1127, the voltage of a first node N1, and the voltage of a second node N2. To this end, the output unit 202 includes the third transistor M3, the fourth transistor M4, a first capacitor C1, and a second capacitor C2.

The third transistor M3 is connected between the first input terminal 1121 and the output terminal 1125. Also, the gate electrode of the third transistor M3 is connected with the first node N1. The third transistor M3 is turned on or off in response to the voltage of the first node N1, and controls the electrical connection of the first input terminal 1121 and the output terminal 1125.

The fourth transistor M4 is connected between the output terminal 1125 and the second power input terminal 1127. Also, the gate electrode of the fourth transistor M4 is connected with the second node N2. The fourth transistor M4 is turned on or off in response to the voltage of the second node N2, and controls the electrical connection of the second power input terminal 1127 and the output terminal 1125.

The first capacitor C1 is connected between the first node N1 and the output terminal 1125. The first capacitor C1 functions as a boosting capacitor as well as a storage of the voltage of the first node N1. That is, the first capacitor C1 increases the voltage of the first node N1 in response to the increase in the voltage of the output terminal 1125 when the third transistor M3 is turned on, thus controlling the third transistor M3 so as to stably maintain a turn-on state.

The second capacitor C2 is connected between the second node N2 and the second power input terminal 1127. The second capacitor C2 stores the voltage of the second node N2.

The first control unit 204 controls the voltage of the first node N1 using the second clock signal CLK2 supplied to the first input terminal 1121 and the voltage of the output terminal 1125. To this end, the first control unit 204 includes the fifth transistor M5 and the sixth transistor M6.

The fifth transistor M5 and the sixth transistor M6 are connected in series between the first node N1 and the output terminal 1125.

The gate electrode of the fifth transistor M5 is connected with the first input terminal 1121. The fifth transistor M5 is turned on when the second clock signal CLK2 is supplied to the first input terminal 1121, and electrically connects the first node N1 with the sixth transistor M6.

The gate electrode of the sixth transistor M6 is connected with the second node N2. The sixth transistor M6 is turned on or off in response to the voltage of the second node N2, and controls the electrical connection of the output terminal 1125 and the fifth transistor M5.

The second control unit 206 stabilizes the voltage of the second node N2. To this end, the second control unit 206 includes the seventh transistor M7.

The seventh transistor M7 is connected between the second node N2 and the first power input terminal 1126. Also, the gate electrode of the seventh transistor M7 is connected with the second node N2. That is, the seventh transistor M7 is connected in the form of a diode in order to enable a current to flow from the second node N2 to the first power input terminal 1126. The seventh transistor M7 prevents the voltage of the second node N2 from increasing higher than the gate-on voltage VGH.

The input unit 208 controls the voltage of the first node N1 in response to the voltage of the output terminal 1125, the gate-on voltage VGH supplied to the first power input terminal 1126, a scan signal SSi−1 of a previous stage, which is supplied to the second input terminal 1122, and a scan signal SSi+2 of a next stage, which is supplied to the fourth input terminal 1124. To this end, the input unit 208 includes the eighth transistor M8 and the ninth transistor M9.

The eighth transistor M8 is connected between the output terminal 1125 and the first node N1. Also, the gate electrode of the eighth transistor M8 is connected with the fourth input terminal 1124. The eighth transistor M8 is turned on when the i+2-th scan signal SSi+2 is supplied to the fourth input terminal 1124, and electrically connects the output terminal 1125 with the first node N1.

The ninth transistor M9 is connected between the second power input terminal 1126 and the first node N1. Also, the gate electrode of the ninth transistor M9 is connected with the second input terminal 1122. The ninth transistor M9 is turned on when the i−1-th scan signal SSi−1 is supplied to the second input terminal 1122, and supplies the gate-on voltage VGH to the first node N1.

The first transistor M1 is connected between the third input terminal 1123 and the second node N2. Also, the gate electrode of the first transistor M1 is connected with the first node N1. The first transistor M1 controls the electrical connection of the third input terminal 1123 and the second node N2 in response to the voltage of the first node N1.

The second transistor M2 is connected between the second node N2 and the first power input terminal 1126. Also, the gate electrode of the second transistor M2 is connected with the third input terminal 1123. The second transistor M2 is turned on when the fourth clock signal CLK4 is supplied to the third input terminal 1123, and supplies the gate-on voltage VGH to the second node N2.

FIG. 6 is a waveform diagram that shows a method for driving the stage circuit illustrated in FIG. 5.

Referring to FIGS. 5 and 6, first, in the first period T1, the fourth clock signal CLK4 is supplied to the third input terminal 1123. When the fourth clock signal CLK4 is supplied to the third input terminal 1123, the second transistor M2 is turned on. When the second transistor M2 is turned on, the gate-on voltage VGH is supplied to the second node N2. When the gate-on voltage VGH is supplied to the second node N2, the fourth transistor M4 is turned on. When the fourth transistor M4 is turned on, the gate-off voltage VGL is supplied to the output terminal 1125.

In the second period T2, the i−1-th scan signal SSi−1 is supplied to the second input terminal 1122. When the i−1-th scan signal SSi−1 is supplied to the second input terminal 1122, the ninth transistor M9 is turned on. When the ninth transistor M9 is turned on, the gate-on voltage VGH is supplied to the first node N1.

When the gate-on voltage VGH is supplied to the first node N1, the first transistor M1 and the third transistor M3 are turned on. Here, the gate-on voltage VGH supplied to the first node N1 is stored in the first capacitor C1. When the first transistor M1 is turned on, the fourth clock signal CLK4, supplied to the third input terminal 1123, is supplied to the second node N2, whereby the fourth transistor M4 maintains a turn-on state. In this case, the gate-off voltage VGL is supplied to the output terminal 1125.

When the third transistor M3 is turned on, the first input terminal 1121 is electrically connected with the output terminal 1125. Here, because the second clock signal CLK2 is not supplied to the first input terminal 1121, the first input terminal 1121 is set to a low level, for example, the gate-off voltage VGL. Accordingly, the output terminal 1125 stably maintains the gate-off voltage VGL during the second period T2.

The supply of the fourth clock signal CLK4 is interrupted before the start of the third period T3. When the supply of the fourth clock signal CLK4 is interrupted, a low-level voltage (for example, VGL) is supplied to the third input terminal 1123. In this case, the voltage of the second node N2 is set to a low level, which causes the fourth transistor M4 to be turned off.

In the third period T3, the second clock signal CLK2 is supplied to the first input terminal 1121. Here, because the third transistor M3 maintains a turn-on state, the second clock signal CLK2 is supplied to the output terminal 1125. The second clock signal CLK2, supplied to the output terminal 1125, is supplied to the i-th scan line Si as the i-th scan signal SSi.

During the third period T3, the voltage of the first node N1 is increased higher than the second clock signal CLK2 due to boosting of the first capacitor C1, whereby the third transistor M3 stably maintains a turn-on state.

Additionally, during a part of the third period T3 (that is, while the i−1-th scan signal Si−1 is being supplied), the ninth transistor M9 maintains a turn-on state, whereby the voltage of the first node N1 may decrease. However, because the part of the third period T3 is set short and because the voltage of the first node N1 is slowly increased by boosting of the first capacitor C1, the voltage of the first node N1 is set such that the third transistor M3 stably maintains a turn-on state.

In the fourth period T4, the operation in the third period T3 is maintained, whereby the i-th scan signal SSi is output to the output terminal 1125. Also, the supply of the second clock signal CLK2 is interrupted before the start of the fifth period T5. When the supply of the second clock signal CLK2 is interrupted, the voltage of the output terminal 1125 decreases to a low level. That is, the supply of the scan signal SSi to the output terminal 1125 is interrupted.

In the fifth period T5, the i+2-th scan signal SSi+2 is supplied to the fourth input terminal 1124. When the i+2-th scan signal SSi+2 is supplied to the fourth input terminal 1124, the eighth transistor M8 is turned on. When the eighth transistor M8 is turned on, the voltage of the output terminal 1125, that is, a low-level voltage, is supplied to the first node N1. Accordingly, the third transistor M3 is set to a turn-off state.

In the fifth period T5, the fourth clock signal CLK4 is supplied to the third input terminal 1123. When the fourth clock signal CLK4 is supplied to the third input terminal 1123, the second transistor M2 is turned on. When the second transistor M2 is turned on, the gate-on voltage VGH is supplied to the second node N2. When the gate-on voltage VGH is supplied to the second node N2, the fourth transistor M4 is turned on. When the fourth transistor M4 is turned on, the gate-off voltage VGL is supplied to the output terminal 1125.

In the sixth period T6, the second clock signal CLK2, supplied to the first input terminal 1121, causes the fifth transistor M5 to be turned on. Here, the sixth transistor M6 is set to a turn-on state in response to the voltage of the second node N2, whereby the low-level voltage of the output terminal 1125 is supplied to the first node N1. That is, the voltage of the first node N1 is set to a low-level voltage whenever the second clock signal CLK2 is supplied, whereby stable operation may be guaranteed. In an exemplary embodiment of the invention, scan signals are supplied to scan lines while the first period T1 to the sixth period T6 are repeated.

Additionally, while the scan signal SSi is not supplied to the output terminal 1125, the gate electrode of the first transistor M1 is set to a low-level voltage, and the voltage of the second node N2 is set to a gate-on voltage VGH. That is, while the scan signal SSi is not supplied to the output terminal 1125, the gate-source voltage Vgs of the first transistor M1 is set to a negative voltage, which may change the threshold voltage characteristic thereof.

Similarly, while the scan signal SSi is not supplied to the output terminal 1125, the gate electrode of the second transistor M2 is set to a low-level voltage for a certain period, and the voltage of the second node N2 is set to a gate-on voltage VGH. That is, while the scan signal SSi is not supplied to the output terminal 1125, the gate-source voltage Vgs of the second transistor M2 is set to a negative voltage for a certain period, which may change the threshold voltage characteristic thereof.

Accordingly, in order to initialize the threshold voltage characteristic of the first transistor M1 and the second transistor M2, an exemplary embodiment of the invention supplies an initialization pulse IP (refer to FIG. 2) to an initialization line IL (refer to FIG. 3) when power is supplied to a display device and/or when the supply of power thereto is interrupted.

Figure 7:
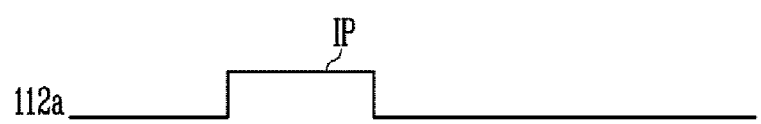
FIG. 7 is a waveform diagram illustrating an exemplary embodiment of a method for initializing a threshold voltage according to the invention.
Figure 7:
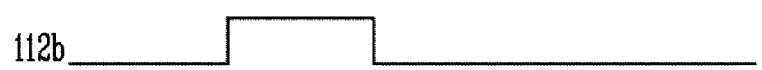
Figure 7:
Figure 7:
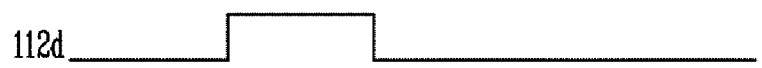
Figure 7:
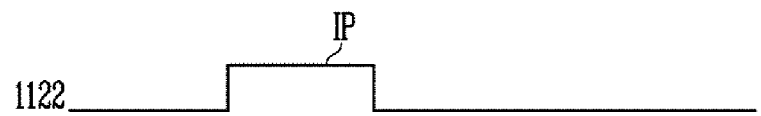

FIG. 7 is a waveform diagram that shows a method for initializing a threshold voltage according to an exemplary embodiment of the invention.

Referring to FIGS. 3, 5 and 7, when an initialization pulse IP is supplied to an initialization line IL, the first control transistors MC1 and the second control transistors MC2 are turned on. When the first control transistors MC1 are turned on, the initialization pulse IP is supplied to the clock lines 112a to 112d. When the second control transistors MC2 are turned on, the initialization pulse IP is supplied to the second input terminal 1122 included in each of stages ST. Here, the initialization pulse IP may be set to a gate-on voltage VGH (i.e., a high-level voltage of the initialization pulse IP).

Describing an operating process with reference to FIG. 5 and FIG. 7, the ninth transistor M9 is turned on when the initialization pulse IP is supplied to the second input terminal 1122. Accordingly, a gate-on voltage VGH is supplied to the gate electrode of the first transistor M1.

When the initialization pulse IP is supplied to the third input terminal 1123, a gate-on voltage VGH is supplied to the drain electrode of the first transistor M1 and the gate electrode of the second transistor M2. Here, the drain electrode of the second transistor M2 is supplied with a gate-on voltage VGH from the first power input terminal 1126.

That is, when an initialization pulse IP is supplied, the gate-source voltage Vgs and drain-source voltage Vds are set to a positive voltage, as illustrated in FIGS. 1A and 1B. Accordingly, the threshold voltage characteristics of the first transistor M1 and the second transistor M2 are initialized.

Because a gate-on voltage VGH is supplied to the gate electrodes of the first transistor M1 and the second transistor M2, the voltage of the second node N2 is increased. Here, the voltage of the second node N2 is slowly increased by the second capacitor C2, whereby the conditions in FIG. 1A and FIG. 1B may be satisfied.

As described above, an exemplary embodiment of the invention periodically initializes the threshold voltage characteristic of at least one transistor included in a stage, whereby the reliability of operation may be guaranteed.

The scan driver and the method for driving the same according to an exemplary embodiment of the invention may initialize the characteristic of at least one specific transistor included in a stage, and may thereby guarantee the reliability of operation. Particularly, an exemplary embodiment of the invention supplies a positive voltage as the gate-source voltage Vgs and the drain-source voltage Vds of a specific transistor (for example, supplies the same gate-source voltage Vgs and drain-source voltage Vds), whereby the threshold voltage of the specific transistor may be initialized.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular exemplary embodiment may be used singly or in combination with features, characteristics, and/or elements described in connection with other exemplary embodiments unless otherwise specifically indicated. Accordingly, it will be understood by those of skill in the art that various changes in form and details may be made without departing from the spirit and scope of the invention as set forth in the following claims.

What is claimed is:

1. A scan driver, comprising:
   a plurality of clock lines which receive clock signals in different phases;
   a plurality of stages connected with at least one of the plurality of clock lines;
   an initialization line which receives an initialization pulse;
   a plurality of first control transistors connected between the initialization line and the plurality of clock lines, the plurality of first control transistors being turned on when the initialization pulse is supplied; and
   a plurality of second control transistors connected between the initialization line and the plurality of stages, the plurality of second control transistors being turned on when the initialization pulse is supplied,
   wherein a number of the plurality of first control transistors is less than a number of the plurality of stages.

2. The scan driver according to claim 1, wherein the initialization pulse is supplied when power is supplied to the scan driver.

3. The scan driver according to claim 1, wherein the initialization pulse is supplied when supply of power to the scan driver is interrupted.

4. The scan driver according to claim 1, wherein each of the plurality of stages includes:
   first to fourth input terminals;
   an output unit which is connected with the first input terminal, a second power input terminal, a first node, and a second node and supplies a scan signal to an output terminal, the first input terminal being connected with a first clock line which is one of the plurality of clock lines, and the second power input terminal being supplied with a gate-off voltage;
   a first control unit which is connected with the first input terminal and the output terminal and controls a voltage of the first node;
   a second control unit which is connected with a first power input terminal and stabilizes a voltage of the second node, the first power input terminal being supplied with a gate-on voltage;
   an input unit which is connected with the second input terminal, the fourth input terminal, the output terminal, and the first power input terminal and controls the voltage of the first node, the second input terminal receiving a scan signal of a previous stage, and the fourth input terminal receiving a scan signal of a next stage;
   a first transistor, connected between the third input terminal and the second node and including a gate electrode connected with the first node, the third input terminal being connected with a second clock line which is one of the plurality of clock lines; and a second transistor, connected between the second node and the first power input terminal and including a gate electrode connected with the third input terminal.

5. The scan driver according to claim 4, wherein each of the plurality of second control transistors is connected between the second input terminal and the initialization line.

6. The scan driver according to claim 5, wherein, when the initialization pulse is supplied, a gate-source voltage and a drain-source voltage of the first transistor and the second transistor are set to a positive voltage during at least some period of time.

7. The scan driver according to claim 6, wherein the gate-source voltage and the drain-source voltage are set to a same voltage as each other.

8. The scan driver according to claim 4, wherein a high-level period of a clock signal supplied to the first clock line does not overlap a high-level period of a clock signal supplied to the second clock line.

9. The scan driver according to claim 4, wherein the output unit includes:
- a third transistor, connected between the first input terminal and the output terminal and including a gate electrode connected with the first node;
- a fourth transistor, connected between the output terminal and the second power input terminal and including a gate electrode connected with the second node;
- a first capacitor connected between the first node and the output terminal; and
- a second capacitor connected between the second node and the second power input terminal.

10. The scan driver according to claim 4, wherein the first control unit includes a third transistor and a fourth transistor, which are connected in series between the first node and the output terminal,
wherein a gate electrode of the third transistor is connected with the first input terminal, and a gate electrode of the fourth transistor is connected with the second node.

11. The scan driver according to claim 4, wherein the second control unit includes a third transistor, connected between the second node and the first power input terminal and including a gate electrode connected with the second node.

12. The scan driver according to claim 4, wherein the input unit includes:
- a third transistor, connected between the output terminal and the first node and including a gate electrode connected with the fourth input terminal; and
- a fourth transistor, connected between the first power input terminal and the first node and including a gate electrode connected with the second input terminal.

13. The scan driver according to claim 1, wherein the number of the plurality of first control transistors is same as a number of the plurality of clock lines.

14. The scan driver according to claim 13, wherein each of the plurality of first control transistors corresponds to each of the plurality of clock lines, respectively.

15. The scan driver according to claim 1, wherein a number of the plurality of second control transistors is same as the number of the plurality of stages.

16. The scan driver according to claim 15, wherein each of the plurality of second control transistors corresponds to each of the plurality of stages, respectively.

* * * * *